US005110618A

United States Patent [19]

Faust

[11] Patent Number: 5,110,618

[45] Date of Patent: May 5, 1992

[54] PROCESS FOR ELECTROSTATICALLY COATING A SUBSTRATE USING AN AEROSOL

[75] Inventor: Horst Faust, Wiesbaden, Fed. Rep. of Germany

[73] Assignee: Hoechst Aktiengesellschaft, Frankfurt/Main, Fed. Rep. of Germany

[21] Appl. No.: 561,881

[22] Filed: Aug. 2, 1990

[30] Foreign Application Priority Data

Aug. 2, 1989 [DE] Fed. Rep. of Germany ....... 3925539

[51] Int. Cl.[5] .............................................. B05D 1/04

[52] U.S. Cl. ......................................... 427/32; 427/27

[58] Field of Search .............................. 427/27, 32, 33

[56] References Cited

U.S. PATENT DOCUMENTS 2,994,618 8/1961 Landgraf .............................. 427/32
4,605,574 8/1986 Yonehara et al. ................ 427/27 X
4,748,043 5/1988 Seaver et al. ..................... 427/32 X
4,944,960 7/1990 Sundholm et al. ................... 427/27

FOREIGN PATENT DOCUMENTS 279371 2/1988 European Pat. Off. .
0195041 12/1988 European Pat. Off. .
3414245 10/1985 Fed. Rep. of Germany .
3705482 9/1988 Fed. Rep. of Germany .
88/04958 7/1988 World Int. Prop. O. .

*Primary Examiner*—Evan Lawrence
*Attorney, Agent, or Firm*—Foley & Lardner

[57] ABSTRACT

A process is provided for coating a substrate with a film which includes at least one vaporizable solvent component and at least one solid component using an electrostatic discharge. A coating solution which includes at least one vaporizable solvent component and at least one solid component is introduced into an atomizing zone and atomized to produce drops. The drops so formed are mixed with an air or gas stream to form an aerosol, subjected to an electrostatic discharge, and blown out of the atomizing zone into a vaporizing zone, where a large portion of the solvent component is vaporized so that the individual drop size of the aerosol is about 50 to 90 percent by volume smaller than the volume of the drop size of the aerosol. Subsequently the aerosol is sprayed onto a charged substrate in an application zone, and then dried so as to fuse the solid components and form a film on the surface of the substrate.

15 Claims, 5 Drawing Sheets

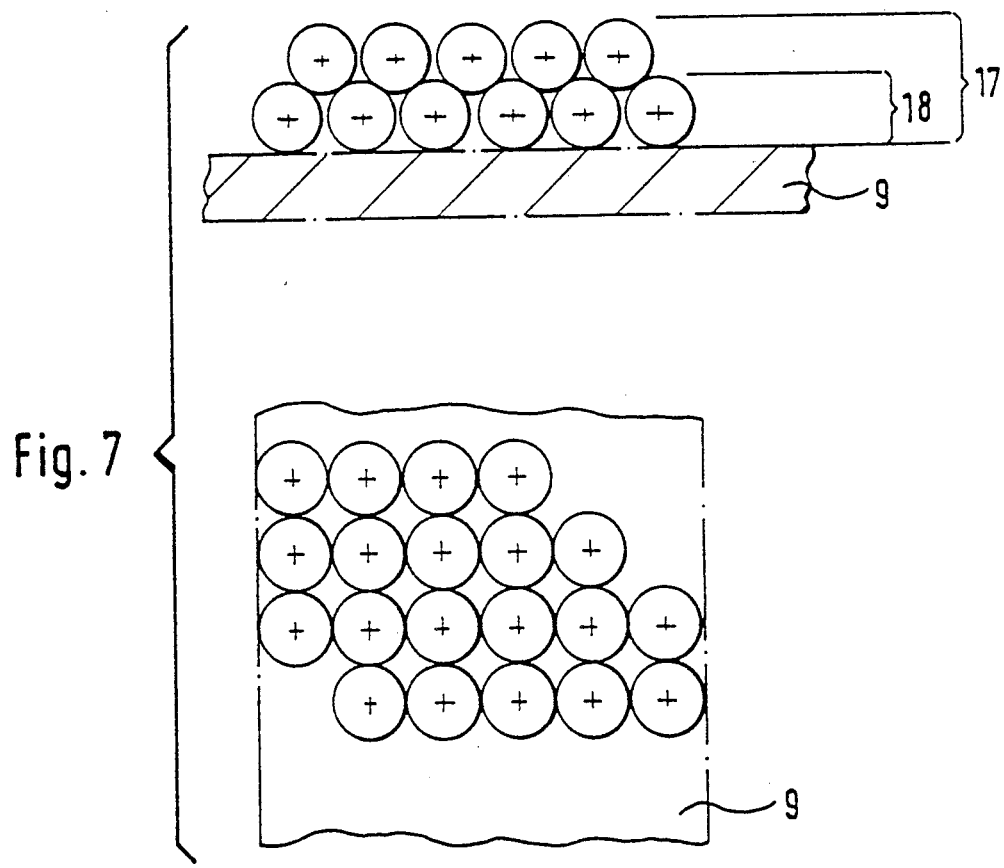

5,110,618

PROCESS FOR ELECTROSTATICALLY COATING A SUBSTRATE USING AN AEROSOL

BACKGROUND OF THE INVENTION

The present invention relates to a process and an apparatus for coating a substrate with a film which contains vaporizable solvent components and solid components, by means of an electric discharge, and for drying the film on the substrate.

It is known to produce printed circuit boards in general by dry-film laminating or by wet coating with a liquid resist. Examples of conventional resist coating methods are dip coating, rolling, casting, screen printing and, in particular for the coating of thin laminates, electrostatic spraying processes.

The principle of the electrostatic spraying process is to disperse a liquid resist via a spraying member into superfine drops, then charge the drops electrically by high voltage and deposit them on a grounded workpiece, for example a substrate. On the surface of the substrate, the drops run to form a wet film, which is subsequently dried.

European Patent 0,195,041 discloses an electrostatic spraying process for printed circuit board coating, in which the substrate is moved substantially perpendicularly to the direction of the spraying apparatus in an electrostatic field, which is generated by a high-voltage generator. A liquid resist is sprayed in the direction of the substrate, which is carried by a conveyor belt, which crosses through an electrostatic field. An electrode of the electrostatic apparatus is connected to ground, while the spraying apparatus for the liquid resist is connected to the high-voltage electrode of a power generator. The spraying apparatus comprises an air turbine, a spraying bell specially developed for liquid resist and means for supplying the liquid resist. The spraying bell is charged, for example, with negative DC voltage in the range from 40 to 90 kV.

Various drying processes and apparatus are used in the drying of large-area substrates in web form to which liquid films have been applied. The applied liquid films generally consist of vaporizable solvent components, which are removed from the liquid film during the drying process, and of non-vaporizable components, which remain on the substrate material after drying.

The coating of metal webs with light-sensitive films which are then made up into printing plates requires special installations in order to ensure the desired product quality of the liquid resist films.

DE-Al 37 05 482 also discloses a process and an arrangement for the surface pretreatment of plastic by means of an electric corona discharge. The arrangement comprises a generator, which applies a high-frequency alternating current of high voltage to the discharge electrode of the corona discharging means, the metal core of a cylinder serving as grounded counter electrode, over the circumferential coating of which cylinder a film web is transported. A housing surrounds the discharge electrodes of the corona discharging means and is connected via a line to an atomizing means, in which a liquid is atomized into drops of an aerosol, capable of suspension, by means of a piezoelectrically-operating ultrasonic vibration system or by two-component atomizer nozzles operating at ultrasonic velocity. A fan, the flow rate of which can be regulated, is connected to the atomizing means and conveys the carrier gas, for example air, for the aerosol through the atomizing means into the corona discharging means.

SUMMARY OF THE INVENTION

It is therefore an object of the present invention to provide a process and an apparatus for coating a substrate with a film in such a way that the homogeneity, the uniformity and the anchoring of the film structure on the substrate are increased without decreasing the coating rate and the film structure applied to the substrate requires a minimal amount of drying.

In accomplishing the foregoing objects there is provided according to the present invention a process for coating a substrate with a film using an electrostatic discharge means, comprising the sequential steps of:

(a) introducing a coating solution which includes at least one vaporizable solvent component and at least one solid component into an atomizing zone;

(b) forming a charged aerosol from the coating solution in the atomizing zone using an air or gas stream and the electrostatic discharge means;

(c) blowing the aerosol out of the atomizing zone into a vaporizing zone;

(d) vaporizing a large portion of the solvent component so that the individual drop size of the aerosol is about 50 to 90 percent by volume smaller than the volume of the drop size of the aerosol formed in step (b);

(e) spraying the aerosol onto a charged substrate in an application zone; and (f) drying the aerosol so as to fuse the solid components and form a film of the surface of the substrate.

Preferably, the solvent vapor produced in step (d) is condensed and recirculated back through the process. Advantageously, the excess of the aerosol in the application zone is extracted and separated into the solvent and solid components, wherein the solvent components are recirculated back through the process.

There also is provided according to the present invention an apparatus for coating a substrate with a film which includes at least one vaporizable solvent component and at least one solid component, comprising:

(a) a high-voltage source having a positive and a negative pole;

(b) an ultrasonic generator connected to the high-voltage source;

(c) an aerosol circuit into which a coating solution or dispersion is introduced;

(d) an atomizing space adjacent to the ultrasonic generator and connected to the aerosol circuit to allow passage of the coating solution or dispersion into the atomizing space;

(e) a fan adjacent to the atomizing space which generates an air or gas stream which together with drops of the coating solution or dispersion forms an aerosol;

(f) a vaporization chamber connected to the atomizing space into which the aerosol passes and a large portion of the component of the aerosol vaporizes;

(g) a fishtail die connected to the vaporization chamber;

(h) means for advancing a substrate past the fishtail die so as to deposit a film of the aerosol in an application zone on the substrate, wherein the substrate-advancing means are connected to the high voltage source;

(d) a dryer arranged around the substrate downstream from the fishtail die.

Preferably, there is provided at least one opening in a dividing wall of the vaporization chamber to extract the solvent vapor and an extraction branch and a condenser through which the solvent vapor is returned to the aerosol circuit. Advantageously, there also is provided an extraction channel for the excess aerosol and a separation chamber for separating the aerosol into the solvent and solid components.

Further objects, features and advantages of the present invention will become apparent from the detailed description of preferred embodiments that follow.

BRIEF DESCRIPTION OF THE DRAWINGS

The present invention is explained in further detail below with reference to illustrative embodiments represented in the following figures, in which:

FIG. 7 shows a side view in section of the film structure and of the substrate as well as a plan view of the substrate together with the film structure.

DETAILED DESCRIPTION OF THE PREFERRED EMBODIMENTS

Figure 1:
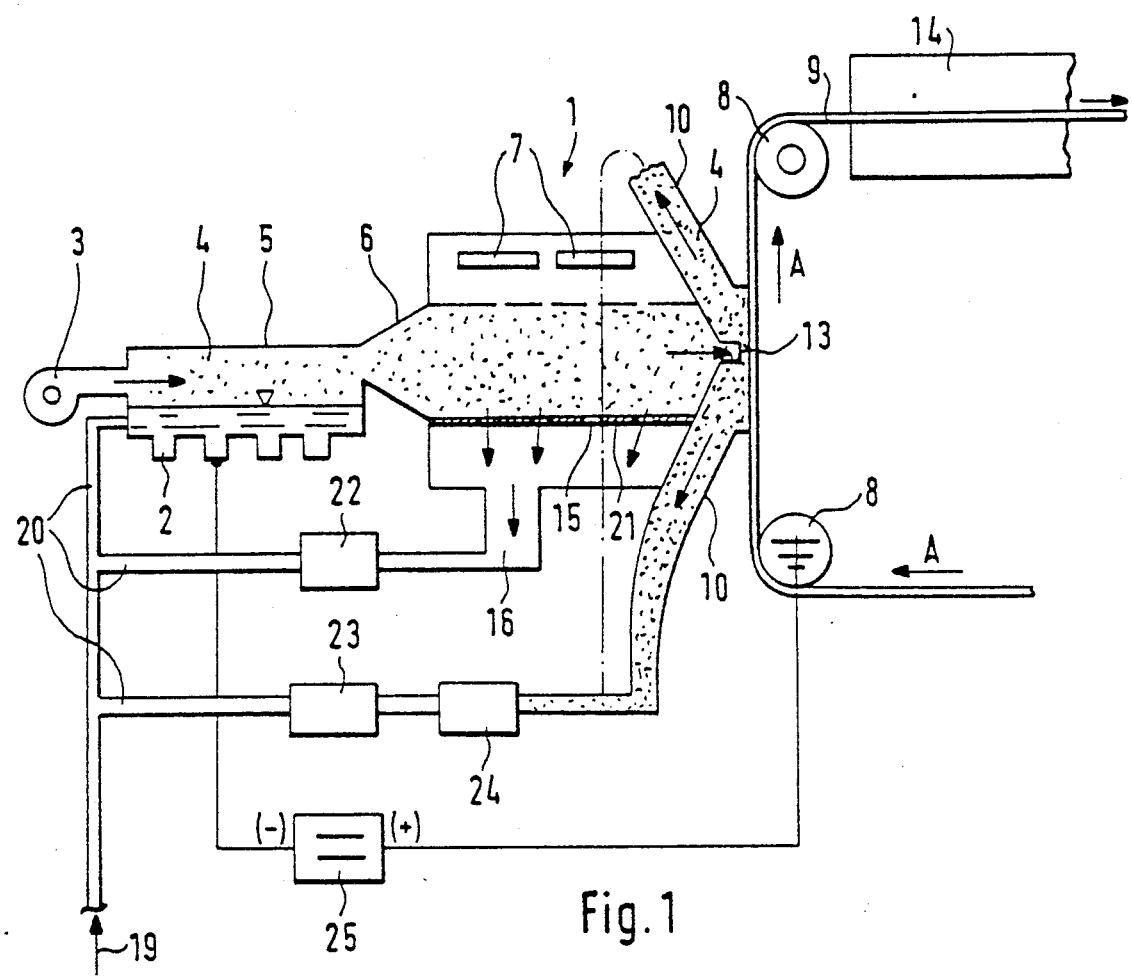
FIG. 1 shows a diagrammatic view of a first embodiment of the present invention with horizontal fishtail die and substrate moved perpendicularly past the fishtail die.
Figure 2:
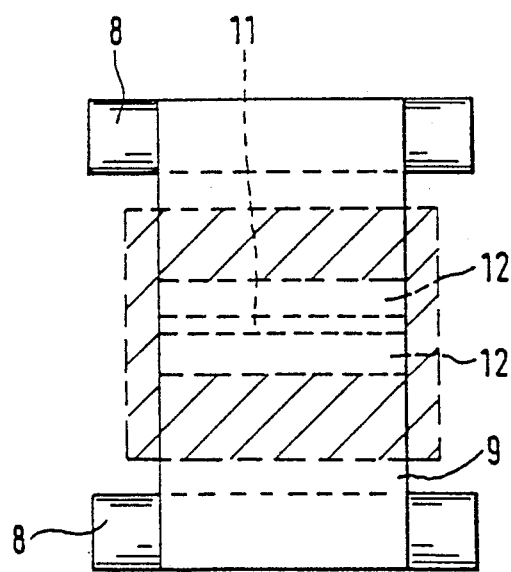
FIG. 2 shows an enlarged plan view of a cutout of the substrate according to FIG. 1.
Figure 3:
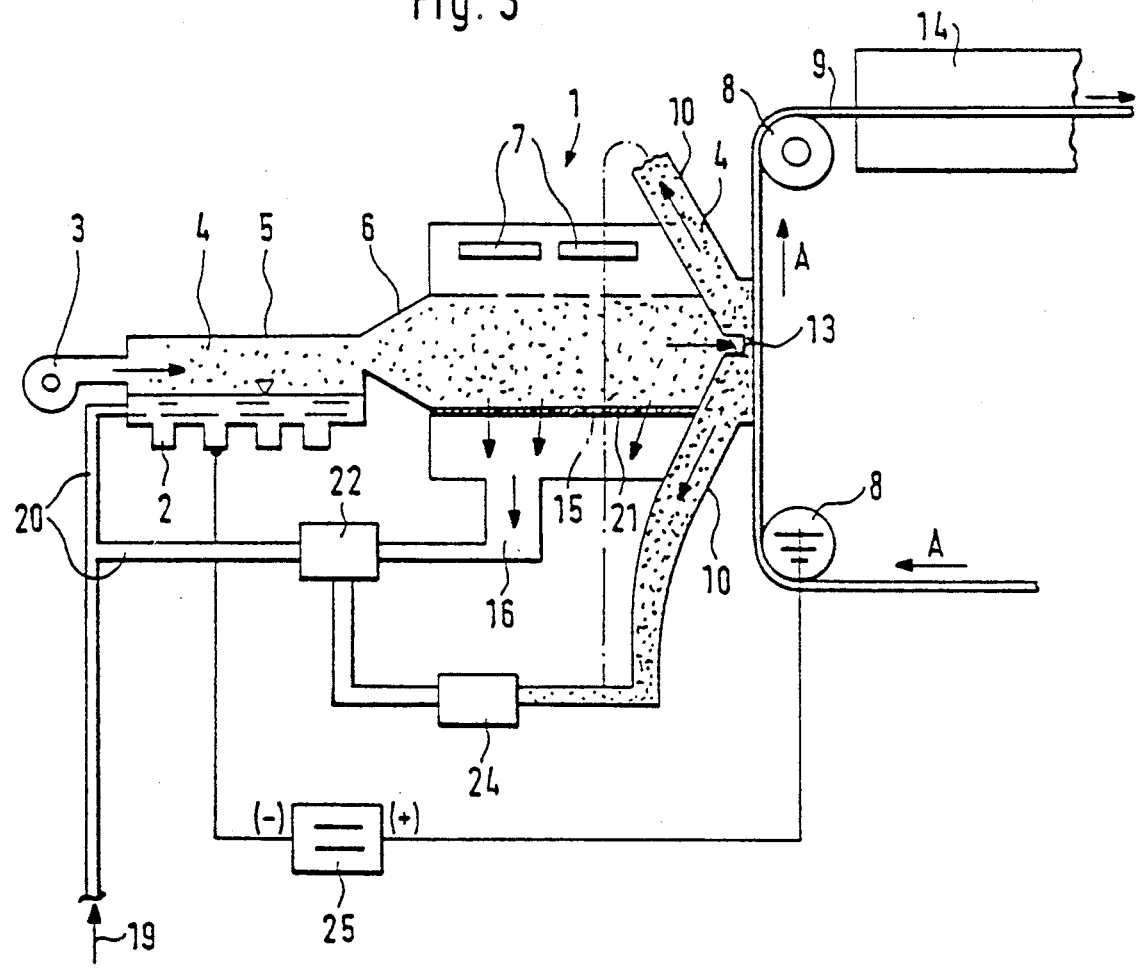
FIG. 3 shows a second embodiment of the apparatus according to the present invention, which is slightly modified from the first embodiment.
Figure 4:
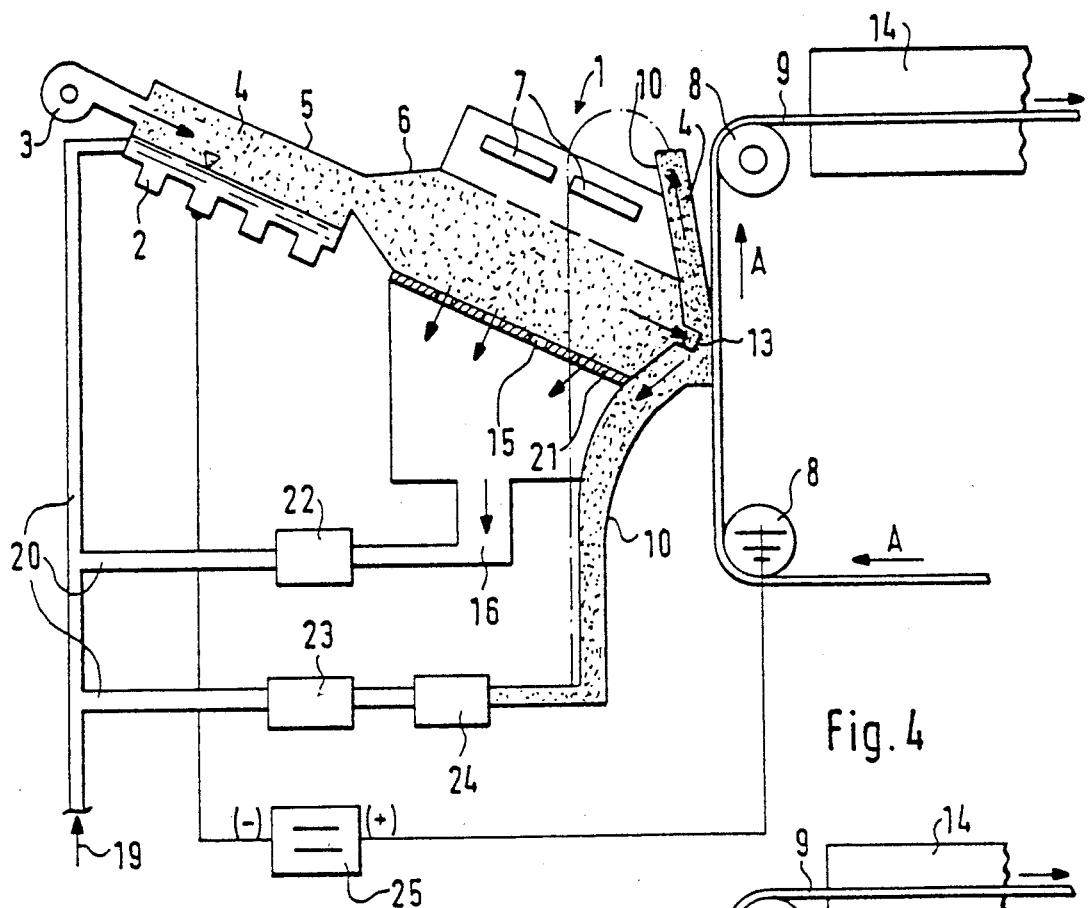
FIGS. 4 and 5 are details of a third embodiment and fourth embodiment of the apparatus, with fishtail dies arranged obliquely to the substrates.
Figure 5:
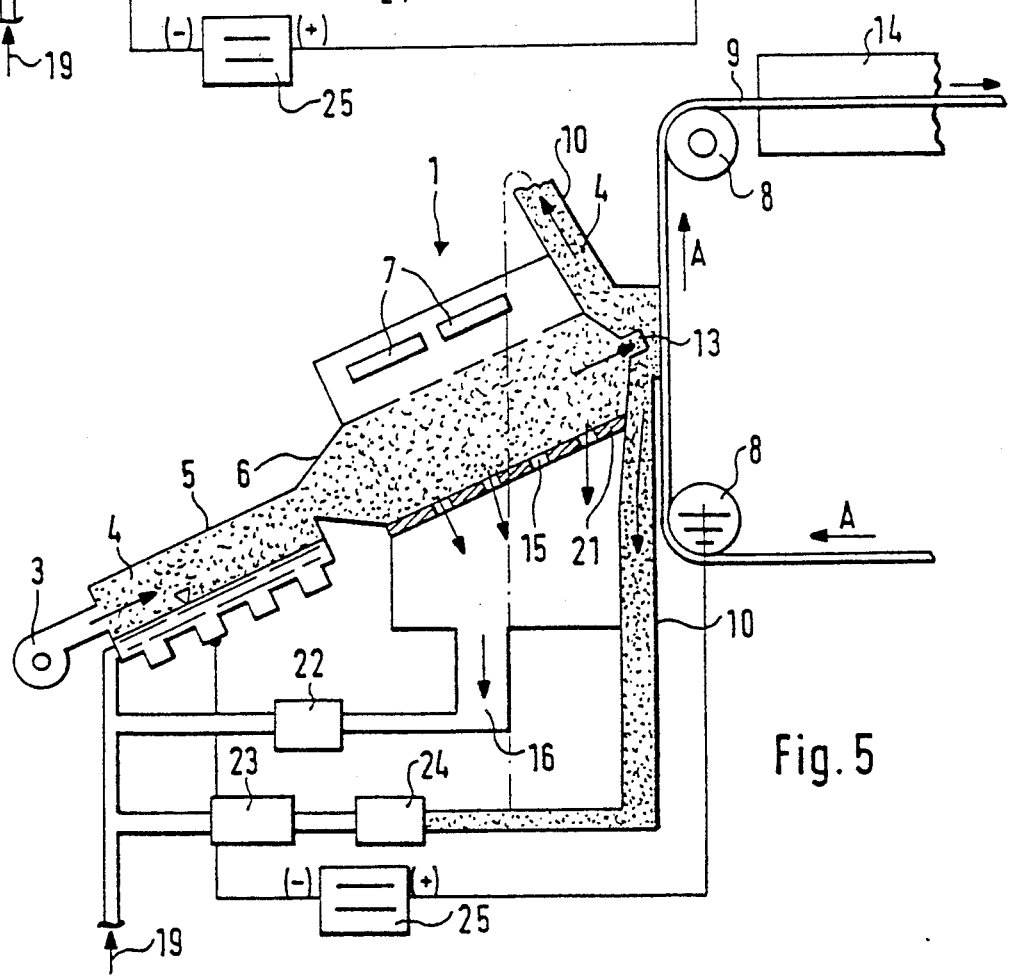
Figure 6:
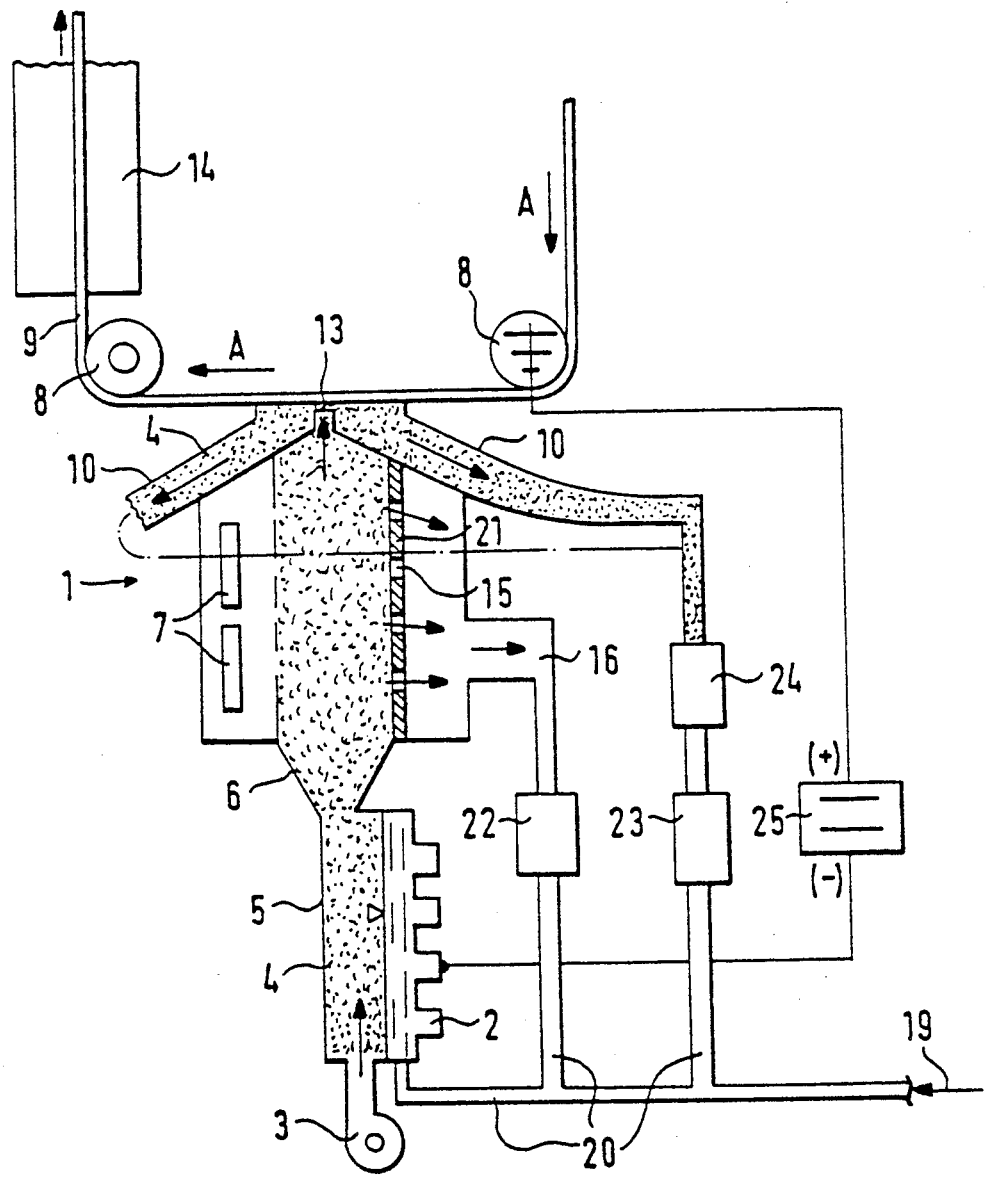
FIG. 6 shows a fifth embodiment, in which the underside of the substrate is coated.

According to the present process, an aerosol is formed from a coating solution in an atomizing zone by means of an air stream or gas stream, the aerosol is blown out of the atomizing zone into a vaporizing zone, in which a large proportion of the solvent vaporizes, so that the individual drop size of the aerosol is about 50 to 90% by volume smaller than the initial drop volume size, and the aerosol is sprayed onto the substrate in an application zone and the solid components of the aerosol are fused onto the substrate surface in a drying zone.

In a refinement of the process, the solvent vapor produced in the vaporizing zone is extracted, condensed and fed to an aerosol circuit.

Similarly, the excess of aerosol in the application zone is recovered by the excess aerosol being extracted in return zones on both sides of the application zone, the aerosol being separated into the solvent components and solid components and the solvent components being returned to the aerosol circuit. The solid components thereby produced are reprocessed.

An apparatus according to the present invention for coating a substrate with a film which contains vaporizable solvent components and solid components comprises a high-voltage source for generating an electrostatic discharge in an aerosol and a dryer for the film on the substrate. The apparatus includes the following features; an ultrasonic generator or oscillator, respectively, connected to an aerosol circuit, into which a coating solution or dispersion is introduced; the ultrasonic generator is adjacent an atomizing space and finely distributes drops of the coating solution into the latter; a fan connected to the atomizing space which generates an air stream or gas stream, which together with the drops of the coating solution forms the aerosol, which is fed to a vaporization chamber in which a large proportion of the solvent components of the aerosol vaporizes; the vaporization chamber opens into a fishtail die, past which the substrate runs; and a dryer through which the substrate passes arranged downstream of the fishtail die, seen in the advancing direction of the substrate.

In an embodiment of the apparatus, a controllable DC voltage source having an output voltage of about 15 to 40 kV is connected to the substrate and to the ultrasonic generator.

In a further embodiment of the apparatus, heat radiation sources are arranged in the vaporization chamber outside the vaporizing zone, which sources vaporize the solvent component of the aerosol located in the vaporizing zone by heat radiation and heat convection, and the solvent vapor is extracted through openings in a dividing wall of the vaporization chamber and returned to the aerosol circuit through an extraction branch via a condenser. Advantageously, there is on either side of the application zone of the fishtail die on the substrate an extraction channel for the excess aerosol, which is separated in a separation chamber into the solvent components and solid components, and the solvent components flow back into the aerosol circuit via a condenser.

A few of the advantages of the present invention reside in a higher coating rate than in the case of conventional methods of coating substrates, in which the liquid film is applied directly via a fishtail die to the substrate surface, that an adverse blowing of the film does not occur in the dryer since the film then consists substantially of only solid components and a minimal amount of solvent components, and that the solvent components are reclaimed. Further advantages arise from the relatively low expenditure of energy in the dryer for fusing the film structure to the substrate, from the uniformity and homogeneity of the film structure independent of mechanical influencing factors due to coating tools such as fishtail die, doctor blade or the like, whereby the desired properties of the light sensitive film on the substrate are improved, and by the simple technical construction of the apparatus.

An apparatus 1, diagrammatically shown in FIG. 1, for coating a substrate 9 with a liquid resist film comprises an ultrasonic generator or oscillator 2, respectively, an atomizing space 5, a vaporization chamber 6, and a fishtail die 13. The ultrasonic generator 2 is connected to an aerosol circuit 20 into which a coating solution or coating dispersion 19 is introduced, as is indicated in FIG. 1 by a corresponding arrow. This coating solution 19 is fed from a tank (not shown). The ultrasonic generator 2 is adjacent the atomizing space 5 and forms a unit with the latter. The coating solution 19 is fed with a predetermined degree of dilution to the ultrasonic generator 2, which vibrates for example at a frequency in the range from about 1 to 2.5 MHz. In the ultrasonic generator 2, the coating solution 19 is atomized into drops having a diameter of about 1 to 3 $\mu$m. A fan 3 is connected to the atomizing space 5 and generates an air stream or gas stream, which forms the carrier gas for an aerosol 4. The drops of the coating solution 5 form together with the carrier gas the aerosol 4, which is indicated in FIG. 1 in the atomizing space 5 and in the vaporization chamber 6 by dots. The aerosol 4 is blown at a rate of about 0.4 to 0.7 m/sec by the fan 3 out of the atomizing space 5 into the vaporization chamber 6.

The coating solution 19 comprises solvent components and solid components. Heat radiation sources 7 are arranged in the vaporization chamber 6 above the vaporizing zone, which sources vaporize the solvent component of the aerosol located in the vaporizing zone by heat radiation and heat convection. In this process, a large proportion of the solvent components of the aerosol 4 is vaporized, so that the individual drop size of the aerosol 4 is about 50 to 90 percent by volume smaller than the initial volume size.

The vaporization chamber 6 joins a conventional fishtail die 13. The fishtail die 13 extends over the entire width of the substrate 9, which is for example an aluminum web having a width of up to about 1200 mm. This substrate strip may, of course, also comprise metals other than aluminum. In addition, a plastic sheeting web may similarly be used as substrate.

In the first embodiment of the apparatus 1, as is represented in FIG. 1, the fishtail die 13, the vaporization chamber 6 and the ultrasonic generator 2 are arranged on approximately the same horizontal plane. The substrate 9 is advanced vertically past the fishtail die 13. Both above and below the fishtail die 13 there is a deflection roller 8 for the substrate 9. A dryer 14, through which the substrate 9 is transported, is arranged downstream of the fishtail die 13 in the running direction A of the substrate 9. The dryer 14 is a conventional dryer, which contains for example heat radiation sources, which are not shown in detail.

The vaporization chamber 6 terminates at the bottom in a dividing wall 21, in which there are openings 15, through which the solvent vapor which is produced inside the vaporization chamber 6 by heat radiation and heat convection in the vaporizing zone is extracted. The extracted solvent vapor passes through an extraction branch 16 into a condenser 22. The suction fan for the extraction of the solvent vapor has not been drawn in for reasons of better clarity. In the condenser 22, the solvent vapor is condensed into the liquid solvent and subsequently returned to the aerosol circuit 20.

On either side of the fishtail die 13 there is an extraction channel 10 for the excess aerosol 4 which is not deposited on the substrate 9. The two extraction channels 10 run symmetrically to the fishtail die 13 and are connected to a separating chamber 24. In FIG. 1, only the connection of the one extraction channel 10 to the separating chamber 24 is represented, for reasons of better clarity, while the path followed by the other extraction channel is shown in dot-dashed lines. In the separating chamber 24, the excess aerosol is separated into the solvent components and solid components, and the solvent components are fed to a further condenser 23, in which they are liquefied and flow back from there into the aerosol circuit 20. The necessary extraction unit for the extraction of the excess aerosol through the extraction channels 10 is not shown. The solid components produced in the separating chamber 24 are reprocessed.

A controllable DC voltage source 25, having an output voltage of about 15 to 40 kV, is connected to the substrate 9 and to the ultrasonic generator 2. In this arrangement, the positive pole of the DC voltage source 25 is connected to the roller core of the lower deflection roller 8, via which the substrate 9 is guided, while the negative pole is connected to the ultrasonic generator 2. The polarity may also be reversed of course, i.e., the substrate 9 is connected to the negative pole and the ultrasonic generator 2 is connected to the positive pole of the DC voltage source 25.

In FIG. 2, an enlarged cutout of the substrate 9 between the two deflection rollers 8 is shown diagrammatically. An application zone 11, which is opposite the slot opening of the fishtail die 13, is produced on the substrate 9. On both sides of this application zone 11 there are return zones 12, which are opposite the cross-sectional surfaces of the extraction channels 10. The excess aerosol, which was not deposited in the application zone 11, produced in the return zones 12 is extracted through the extraction channels 10, as already explained above.

Due to the DC voltage source 25, the substrate is either at positive potential or negative potential and the aerosol 4 in the atomizing space 5 and in the fishtail die 13 is correspondingly at negative or positive potential, respectively.

The individual drop size of the aerosol 4 in the vaporization chamber 6 approximates the size of solid particle components in super-fine powder form of the coating solution so that the film applied through the fishtail die 13 to the substrate 9 substantially contains only the solid components and a minimal amount of the solvent components. The thickness of the film applied is determined by the quantity of aerosol and by the amplitude of the voltage applied for the electrostatic discharge in the aerosol.

A second embodiment of the apparatus 1 is represented in FIG. 3. This embodiment is modified only slightly from the first embodiment according to FIG. 1, so only the difference from the first embodiment is described. Otherwise, the same reference numerals are used for the same components as in the case of the first embodiment according to FIG. 1, and they are not described again.

The extraction branch 16 underneath the dividing wall 21 of the vaporization chamber 6 is connected to a condenser 22, to which the extraction channels 10 above and below the fishtail die 13 are also connected. From the condenser 22, a line runs to the aerosol circuit 20. Both extraction channels 10 run initially to the separating chamber 24 and from the latter to the common condenser 22.

The third embodiment and fourth embodiment of the apparatus 1 differ from the first embodiment according to FIG. 1 only in that the fishtail die 13 and the vaporization chamber 6 are arranged at an incline to the vertically advancing substrate 9, as is represented diagrammatically in FIGS. 4 and 5. In FIG. 4, the fishtail die 13 is inclined toward the horizontal from above, whereas according FIG. 5 the fishtail die 13 is inclined toward the horizontal from below. All other components of the third embodiment and fourth embodiment are identical to the correspondingly designated components of the first embodiment according to FIG. 1, so there is no need to repeat the description of these components and their mode of operation.

In FIG. 6, a fifth embodiment of the apparatus 1 is shown diagrammatically, in which the substrate is advanced horizontally past the fishtail die 13, which is arranged together with the vaporization chamber 6, the atomizing space 5, the fan 3 and the ultrasonic generator 2 below the substrate 9. The fishtail die 13 is positioned vertically, i.e., perpendicularly to the horizontal underside of the substrate 9.

The other components of the fifth embodiment correspond substantially to the corresponding components of the first embodiment, so they are not described again. Although it is not shown, in further embodiments the fishtail die 13 may also be arranged at an inclination to the underside of the horizontally taken substrate 9. Accordingly, the other components of the apparatus, if in direct connection with the fishtail die 13, are correspondingly arranged at an inclination to the substrate 9.

In FIG. 7, a section through the film structure and the substrate as well as a plan view of the substrate with its film structure are represented diagrammatically.

As already mentioned above, a drop size of the aerosol which approximates the size of the solid particles in the superfine particle form of the solid components is produced in the vaporization chamber 6. The aerosol 4 is sprayed through the fishtail die 13 onto the substrate 9 in web form, in the application zone 11. Due to the opposed charging of aerosol and the substrate, a surface-covering film structure 17 is achieved, as is represented in FIG. 7. All free locations in the application zone on the substrate 9 are covered with aerosol in drop or bead form. In FIG. 7, a film structure 17 of at least two individual films 18 is represented, but there may also be several individual films 18 lying one on top of the other. The positive charging of the individual drops of the aerosol in the individual films 18 is indicated by a plus sign. However, it is similarly possible for the aerosol to be negatively charged and the substrate to be at positive potential. The film thickness of the film structure 17 is determined by the number of individual films 18 lying one on top of the other. In general, the film structure 17 is formed from individual films 18 lying one on top of the other by a plurality of coating operations. This can be performed by the substrate being taken successively past a plurality of fishtail dies 13 or running repeatedly past a single fishtail die 13 in a closed circuit. Similarly, it is possible to produce the film structure 17 from a plurality of individual films 18 in a single coating operation on the substrate 9 by applying a higher voltage for the electrostatic discharge than for an individual film and spraying a greater quantity of aerosol through the fishtail die onto the substrate than for an individual film.

The individual films of aerosol anchored in drop or bead form cover the entire surface on the substrate 9, begin transforming into the solid state and are fused to one another and to the substrate surface in the dryer 14, for example by radiation heat.

What is claimed is:

1. A process for coating a substrate with a film which includes at least one vaporize solvent component and at least one solid component using an electrostatic discharge means, comprising the steps of:
   (a) introducing a coating solution which includes at least one vaporizable solvent component and at least one solid component into an atomizing zone;
   (b) atomizing the coating solution introduced into the atomizing zone to produce drops;
   (c) mixing the coating solution drops with an air or gas stream to form an aerosol;
   (d) electrically charging the aerosol using the electrostatic discharge means;
   (e) blowing the aerosol out of the atomizing zone into a vaporizing zone;
   (f) vaporizing a large portion of the solvent component so that the individual drop size of the aerosol is about 50 to 90 percent by volume smaller than the volume of the drop size of the aerosol formed in step (c);
   (g) spraying the aerosol onto a charged substrate in an application zone; and
   (h) drying the aerosol so as to fuse the solid components and form a film on the surface of the substrate.

2. A process as recited in claim 1, further comprising the steps of extracting solvent vapor produced in step (f), condensing the vapor and feeding the vapor to an aerosol circuit to recirculate the condensed vapor back through the process recited in claim 1.

3. A process as recited in claim 2, further comprising the steps of extracting the excess of aerosol in the application zone via return zones on both sides of the application zone, separating the aerosol into the solvent components and solid components, returning the solvent components to the aerosol circuit and reprocessing the solid components.

4. A process as recited in claim 1, wherein the substrate is at positive potential and the aerosol is at negative potential via the electro static discharge means.

5. A process as recited in claim 1, wherein the substrate is at negative potential and the aerosol is at positive potential via the electrostatic discharge means.

6. A process as recited in claim 1, wherein step (f) further comprises applying heat radiation and heat convection to the aerosol during vaporization.

7. A process as recited in claim 1, further comprising transporting continuously the substrate, which is in the form of a web through the application zone.

8. A process as recited in claim 7, further comprising advancing the substrate vertically through the application zone and spraying the aerosol horizontally or obliquely onto the substrate.

9. A process as recited in claim 7, further comprising advancing the substrate horizontally and applying the aerosol onto the underside of the horizontally advancing substrate.

10. A process as recited in claim 1, wherein the individual drop size of the aerosol in step (f) approximates the size of the solid particle components of the film to be applied to the substrate.

11. A process as recited in claim 1, further comprising applying a plurality of film layers to the substrate via a plurality of coating operations.

12. A process as recited in claim 1, further comprising controlling the thickness of the applied film by adjusting the quantity of aerosol sprayed and the amplitude of the voltage of the electrostatic discharge.

13. A process as recited in claim 1, wherein step (g) results in the anchoring of the aerosol on the substrate in bead form over the entire surface of the substrate, and wherein the aerosol drops are fused mutually and to the surface of the substrate by means of heat radiation during the drying.

14. A process as recited in claim 1, wherein the coating solution is atomized via an ultrasonic generator or oscillator.

15. A process as recited in claim 1, wherein the electrostatic discharge means comprises a high-voltage source having a positive and a negative pole.

* * * * *